United States Patent
Shyu et al.

(10) Patent No.: US 6,995,451 B2
(45) Date of Patent: Feb. 7, 2006

(54) BURIED COLLAR TRENCH CAPACITOR FORMED BY LOCOS USING SELF STARVED ALD NITRIDE AS AN OXIDATION MASK

(75) Inventors: James Shyu, Hsinchu (TW); Hsi-Chieh Chen, Hsinchu (TW); Chuan-Chi Chen, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/749,771

(22) Filed: Dec. 30, 2003

(65) Prior Publication Data

US 2005/0151178 A1 Jul. 14, 2005

(51) Int. Cl.
*H01L 21/20* (2006.01)
*H01L 29/00* (2006.01)
(52) U.S. Cl. ...................... 257/532; 438/389
(58) Field of Classification Search ........ 438/386–392; 257/532–535
See application file for complete search history.

(56) References Cited

U.S. PATENT DOCUMENTS

| | | | | |
|---|---|---|---|---|
| 5,142,438 | A | * | 8/1992 | Reinberg et al. ............. 361/313 |
| 6,025,245 | A | * | 2/2000 | Wei .............................. 438/386 |
| 2003/0123216 | A1 | * | 7/2003 | Yoon et al. .................. 361/303 |

FOREIGN PATENT DOCUMENTS

EP 0 980 100 A2 * 2/2000

OTHER PUBLICATIONS

Senzaki et al., "Atomic Layer Deposition of High-k Thin Films for Gate and Capacitor Dielectrics," 2004 International Conference on Integrated Circuit Design and Technology, pp. 269-274.*
Gutsche et al., "Capacitance Enhancement Techniques for Sub-100nm Trench DRAMs", Dec. 2001, Electron Devices meeting 2001 IEDM technical Digest, pp. 18.6.1-18.6.4.*
"A model for $Al_2O_3$ ALD conformity and deposition rate from oxygen precursor reactivity," G. Prechtl et al., IEDM, 2003, pp. 245-248.

* cited by examiner

*Primary Examiner*—Evan Pert
(74) *Attorney, Agent, or Firm*—Finnegan, Henderson, Farabow, Garrett & Dunner, L.L.P.

(57) ABSTRACT

A method for manufacturing a trench capacitor that comprises defining a semiconductor substrate, forming a trench with a lower region and an upper region in the semiconductor substrate, forming a buried conductive region around the lower region, forming a first insulating layer along sidewalls of the trench up to a level between the lower region and the upper region, forming a second insulating layer along the sidewalls of the trench at the upper region, the second insulating layer being separated from the first insulating layer by an intermediate region, and forming an oxide on the sidewalls of the trench at the intermediate region.

20 Claims, 4 Drawing Sheets

BURIED COLLAR TRENCH CAPACITOR FORMED BY LOCOS USING SELF STARVED ALD NITRIDE AS AN OXIDATION MASK

FIELD OF THE INVENTION

This invention pertains in general to a semiconductor device, and, more particularly, to a trench capacitor and a method of manufacturing the trench capacitor.

BACKGROUND OF THE INVENTION

Dynamic random access memory ("DRAM") cells are generally used in the art to store information. A DRAM cell may include a storage capacitor for storing information in the form of electric charges and a field-effect transistor for reading the electric charges. As semiconductor devices become more highly integrated, the area occupied by a storage capacitor is accordingly decreased, resulting in a decrease of capacitance. However, the capacitance required for a DRAM cell is fixed. One way to resolve the problem is to extend the height of the storage capacitor in order to increase its surface area. A trench capacitor is therefore introduced.

FIGS. 1A to 1D are diagrams showing a method in the art for manufacturing a silicon-insulator-silicon ("SIS") trench capacitor. Referring to FIG. 1A, a trench 12 is formed in a semiconductor substrate 10 using a silicon nitride layer 16 as a mask and an oxide layer 14 as a pad layer. A buried plate 18 to serve as a first capacitor plate of the trench capacitor is formed at a lower region (not numbered) of trench 12. A dielectric layer 20 to serve as a capacitor dielectric of the trench capacitor is then formed along sidewalls (not numbered) of trench 12.

Referring to FIG. 1B, a first conductive layer 22 is filled in trench 12 and recessed to a level at the lower region, exposing a portion of dielectric layer 20. The exposed portion of dielectric layer 20 is removed. An oxide layer 24a is then deposited and annealed.

Referring to FIG. 1C, portions of oxide layer 24a are etched away to leave the remaining oxide layer 24b. A second conductive layer 26 is then filled in trench 12 and recessed, exposing a portion of the remaining oxide layer 24b.

Referring to FIG. 1D, a collar oxide 24c is formed by etching away the exposed remaining oxide 24b. A collar oxide of a DRAM cell functions to prevent a leakage current from a diffused region, for example, a source or a drain, of a transistor of the DRAM cell to a buried plate. A third conductive layer 28 is then filled in trench 12 and recessed to form a buried strap. A buried strap functions to connect a trench capacitor of a DRAM cell to a transistor of the DRAM cell.

In the above-mentioned method, collar oxide 24c may be formed using a chemical vapor deposition ("CVD") process, for example, a sub-atmospheric CVD ("SACVD"). Collar oxide 24c formed on the sidewalls of trench 12 by CVD disadvantageously results in a decrease of trench opening and a high series resistance. Furthermore, it is necessary for the above-mentioned method to etch away the remaining oxide layer 24b to prevent an oxide interface disposed between first conductive layer 22 and second conductive layer 26, which also disadvantageously results in a high series resistance.

SUMMARY OF THE INVENTION

Accordingly, the present invention is directed to methods that obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the methods particularly pointed out in the written description and claims thereof, as well as the appended drawings.

To achieve these and other advantages, and in accordance with the purpose of the invention as embodied and broadly described, there is provided a method for manufacturing a trench capacitor that comprises defining a semiconductor substrate, forming a trench with a lower region and an upper region in the semiconductor substrate, forming a buried conductive region around the lower region, forming a first insulating layer along sidewalls of the trench up to a level between the lower region and the upper region, forming a second insulating layer along the sidewalls of the trench at the upper region, the second insulating layer being separated from the first insulating layer by an intermediate region, and forming an oxide on the sidewalls of the trench at the intermediate region.

In one aspect of the present invention, the method further comprises forming the first insulating layer along the sidewalls of the trench, filling the trench with a photoresist, recessing the photoresist to the level to expose a portion of the first insulating layer, and removing the exposed first insulating layer.

Also in accordance with the present invention, there is provided a method for manufacturing a trench capacitor that comprises defining a semiconductor substrate, forming a trench with a lower region and an upper region in the semiconductor substrate, forming a buried conductive region around the lower region, forming a first insulating layer along sidewalls of the trench, filling the trench with a photoresist, recessing the photoresist to a first level between the lower region and the upper region to expose a portion of the first insulating layer, removing the exposed first insulating layer, forming a second insulating layer along the sidewalls of the trench at the upper region, the second insulating layer being separated from the first insulating layer by an intermediate region, and oxidizing the sidewalls at the intermediate region using the first and second insulating layers as masks.

In one aspect of the present invention, the method further comprises forming the second insulating layer in an atomic layer deposition (ALD) process.

In another aspect of the present invention, the method further comprises forming the oxide in a local oxidation of silicon (LOCOS) process.

Still in accordance with the present invention, there is provided a method of manufacturing a trench capacitor that comprises defining a semiconductor substrate, forming a trench with a lower region and an upper region in the semiconductor substrate, the trench further including sidewalls, forming a first conductive region around the lower region, forming a collar oxide on and into the sidewalls of the trench at an intermediate region between the lower region and the upper region, forming a dielectric layer along the sidewalls up to a level above the collar oxide, and forming a second conductive layer up to the level.

Yet still in accordance with the present invention, there is provided a trench capacitor that comprises a trench formed into a semiconductor substrate including a lower region and an upper region, a first conductive region formed around the lower region of the trench, a collar oxide formed on and into sidewalls of the trench at an intermediate region between the lower region and the upper region, a dielectric layer formed along the sidewalls of the trench up to a level above the collar oxide, and a second conductive region formed up to the level.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

FIGS. 2A to 2I are diagrams showing a method for manufacturing a trench capacitor in accordance with one embodiment of the present invention.

Figure 2A:
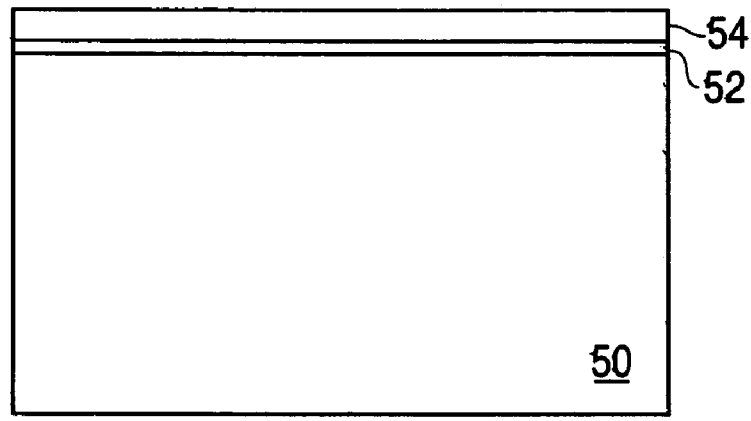
FIGS. 2A to 2I are diagrams showing a method for manufacturing a trench capacitor in accordance with one embodiment of the present invention.

Referring to FIG. 2A, a semiconductor substrate 50 is defined. Specifically, semiconductor substrate 50 is cleaned and slightly doped with, for example, p-type dopants such as boron (B). A patterned pad oxide layer 52 is formed on a top surface (not numbered) of semiconductor substrate 50, and a patterned silicon nitride layer 54 is formed over pad oxide layer 52.

Figure 2B:
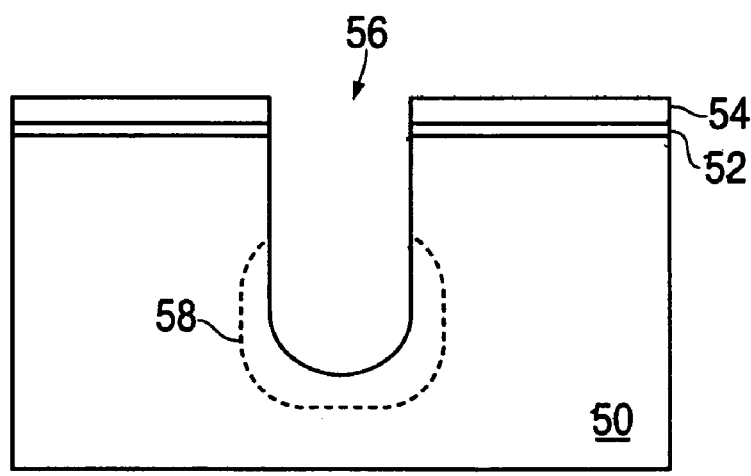

Referring to FIG. 2B, a trench 56 is formed into semiconductor substrate 50 using silicon nitrite layer 54 as a mask. In one embodiment according to the invention, trench 56 has a depth of approximately 6 to 8 micrometers ($\mu$m). A buried plate 58, which functions to serve as a first capacitor plate of the trench capacitor, is then formed around a lower region (not numbered) of trench 56. In one embodiment, the lower region is approximately 2.5 $\mu$m from the top surface of semiconductor substrate 50. Buried plate 58 may be formed, for example, by diffusion from an arsenic silicate glass ("ASG") layer formed on sidewalls (not numbered) of trench 56. The remaining dopant, i.e., arsenic (As), is removed after the diffusion.

Figure 2C:
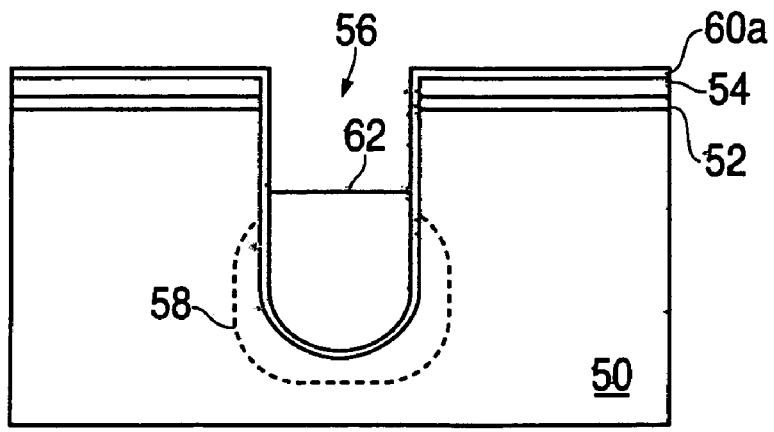

Referring to FIG. 2C, a first insulating layer 60a is deposited, for example, by a low pressure CVD ("LPCVD") along the sidewalls of trench 56. First insulating layer 60a includes, for example, silicon nitride. A photoresist ("PR") 62 is then filled in trench 56 and recessed to a first level between the lower region and an upper region (not numbered) of trench 56, exposing a portion of first insulating layer 60a. In one embodiment according to the invention, the first level is approximately 1 $\mu$m from the top surface of semiconductor substrate 50.

Figure 2D:
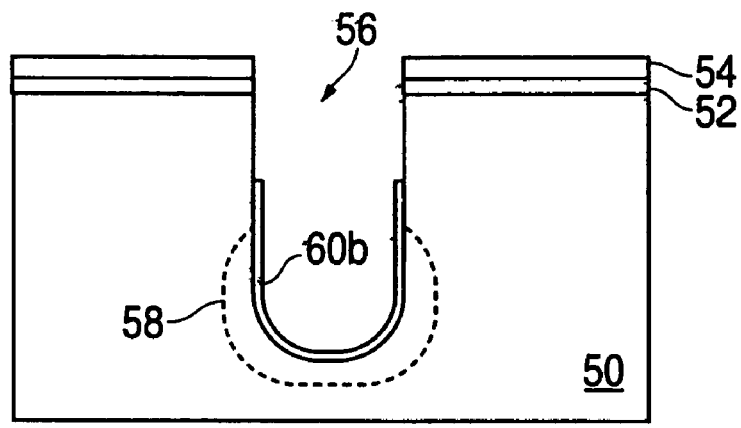

Referring to FIG. 2D, the exposed portion of first insulating layer 60a is removed using PR 62 as a mask. PR 62 is then removed to leave the remaining first insulating layer 60b.

Figure 2E:
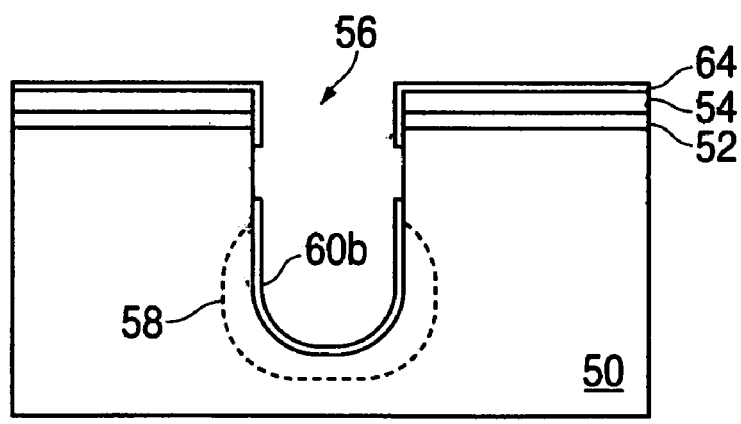

Referring to FIG. 2E, a second insulating layer 64 is deposited, for example, by a self-limiting atomic layer deposition ("ALD") process. Second insulating layer 64 includes, for example, silicon nitride. In a self-limiting ALD process deposition cycle, each reactant gas is sequentially introduced. A second reactant might only bond to a first reactant which may have formed chemical bonds on a finite number of sites on a semiconductor substrate. A desired film thickness can be controlled to atomic layer or angstrom level accuracy by in a predetermined number of deposition cycles. The deposition time of the self-limiting ALD process is controlled so that second insulating layer 64 is formed along the sidewalls of trench 56 at the upper region and separated from the remaining first insulating layer 60b by an intermediate region (not numbered). In one embodiment according to the invention, second insulating layer 64 is deposited down to a level of approximately 0.18 $\mu$m from the top surface of semiconductor substrate 50.

Figure 2F:
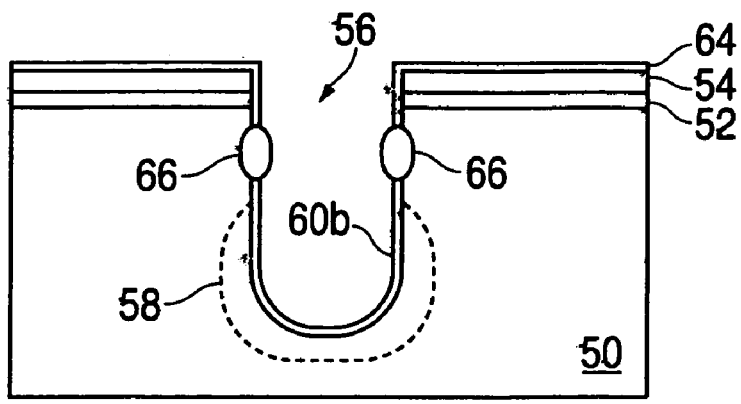

Referring to FIG. 2F, a collar oxide 66 is formed at the intermediate region. In one embodiment according to the invention, collar oxide 66 is formed by oxidizing the sidewalls of trench 56 at the intermediate region in a local oxidation of ("LOCOS") process. The remaining first insulating layer 60b and second insulating layer 64 are used as masks in the LOCOS process. Collar oxide 66 is grown on and into the sidewalls of trench 56 at the intermediate region, resulting in a sunken silicon oxide isolation region. After collar oxide 66 is formed, the remaining first insulating layer 60b and second insulating layer 64 are removed by a conventional etching process having high nitride/oxide etching selectivity.

Figure 2G:
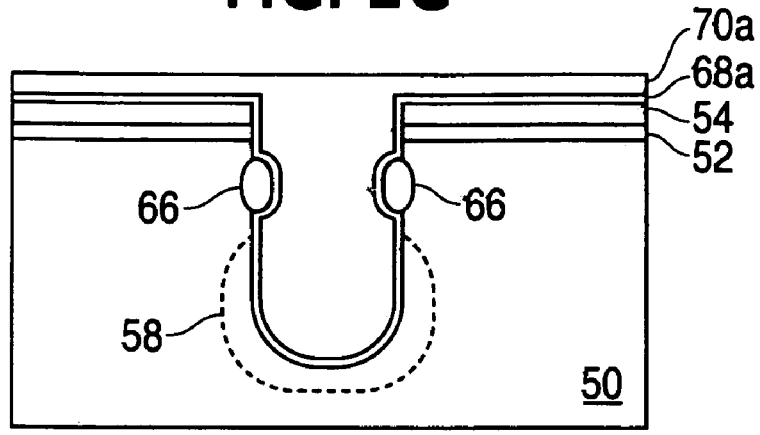

Referring to FIG. 2G, a dielectric layer 68a is deposited. In one embodiment according to the invention, dielectric layer 68a includes a silicon nitride-silicon oxide (NO) structure. In another embodiment, dielectric layer 68a includes a silicon oxide-silicon nitrate-silicon oxide (ONO) structure. A first conductive layer 70a is then deposited. First conductive layer 70a includes, for example, doped polysilicon.

Figure 2H:
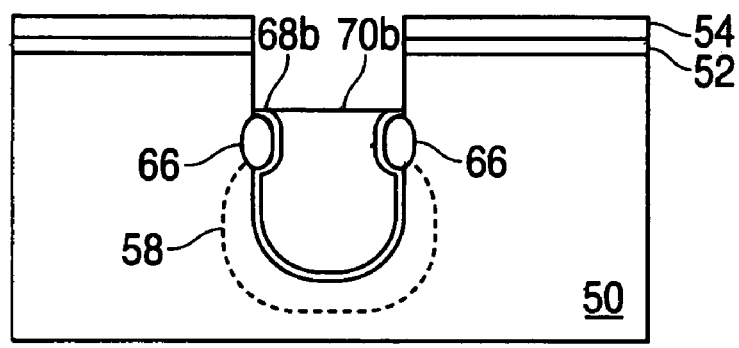

Referring to FIG. 2H, first conductive layer 70a is recessed to a level above collar oxide 66, exposing a portion of dielectric layer 68a. In one embodiment according to the invention, the level is aligned with a top level (not numbered) of collar oxide 66. The remaining first conductive layer 70b functions to serve as a second capacitor plate of the trench capacitor. The exposed portion of dielectric layer 68a is removed using the remaining first conductive layer 70b as a mask. The remaining dielectric layer 68b functions to serve as a capacitor dielectric of the trench capacitor.

Figure 2I:
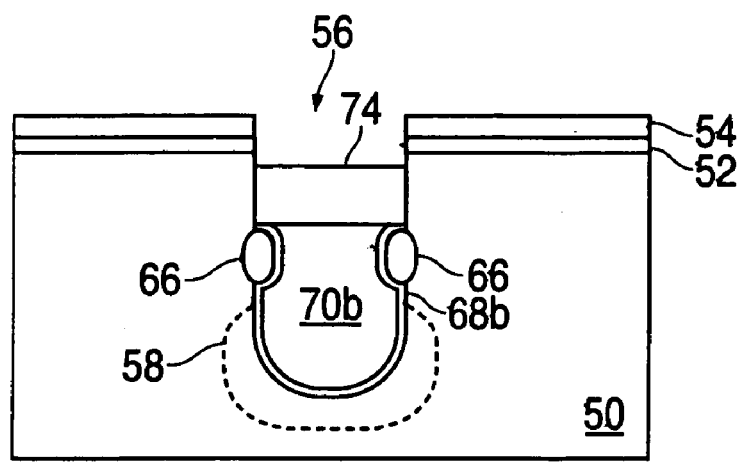

Referring to FIG. 2I, a second conductive layer 74 is then deposited and recessed to form a buried strap.

Figure 1A:
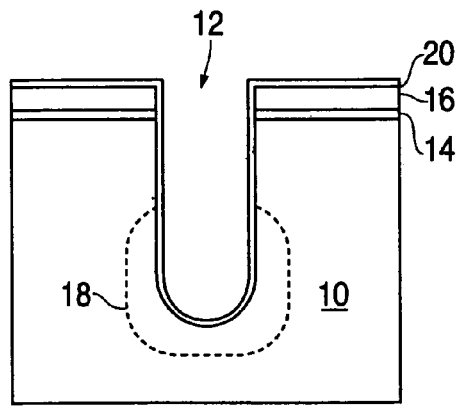
FIGS. 1A to 1D are diagrams showing a method in the art for manufacturing a silicon-insulator-silicon ("SIS") trench capacitor.
Figure 1B:
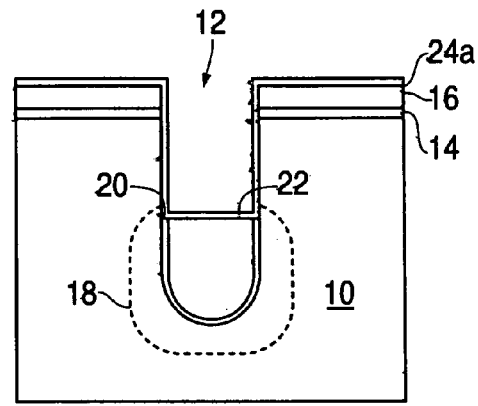
Figure 1C:
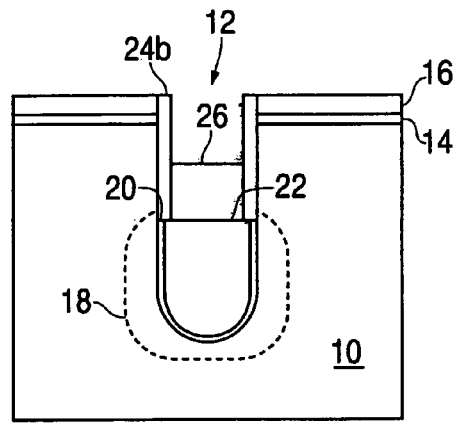
Figure 1D:
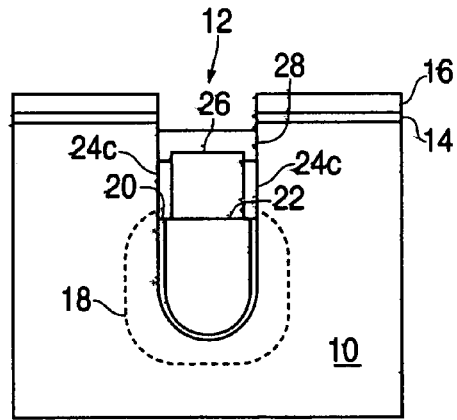

The present invention also provides a trench capacitor (not numbered) that includes a trench 56, a first conductive region 58, a collar oxide 66, a dielectric layer 68b, and a second conductive region 70b. Trench 56 is formed into a semiconductor substrate 50, and further includes a lower region (not numbered) and an upper region (not numbered). First conductive region 58 is formed around the lower region of trench 56, and functions to serve as a first capacitor plate of the trench capacitor. Collar oxide 66 is formed on and into sidewalls of trench 56 at an intermediate region (not numbered) between the lower and upper regions. As compared with collar oxide 24c shown in FIG. 1C totally formed on the sidewalls of trench 12, collar oxide 66 partly formed on the sidewalls and partly formed into the sidewalls of trench 56 results in an advantageous increase of trench opening and a reduction of series resistance.

Dielectric layer 68b is formed along the sidewalls of trench 56 up to a first level above collar oxide 66. In one embodiment according to the invention, the first level is aligned with a top level of collar oxide 66. Dielectric layer 68b functions to serve as a capacitor dielectric of the trench capacitor. In one embodiment, dielectric layer 68b includes a silicon nitride-silicon oxide (NO) structure. In another embodiment, dielectric layer 68b includes a silicon oxide-silicon nitride-silicon oxide (ONO) structure. Second conductive region 70b is formed up to the first level. The trench further includes a third conductive region 74 formed over second conductive region 70b to serve as a buried strap.

It will be apparent to those skilled in the art that various modifications and variations can be made in the disclosed methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a trench capacitor comprising:
    defining a semiconductor substrate;
    forming a trench with a lower region and an upper region in the semiconductor substrate;
    forming a buried conductive region around the lower region;
    forming a first insulating layer along sidewalls of the trench up to a level between the lower region and the upper region;
    forming a second insulating layer along the sidewalls of the trench at the upper region, the second insulating layer being separated from the first insulating layer by an intermediate region; and
    forming an oxide on the sidewalls of the trench at the intermediate region.

2. The method of claim 1 further comprising:
    removing the first and second insulating layers;
    forming a dielectric layer along the sidewalls and a bottom surface of the trench;
    filling the trench with a first conductive layer;
    recessing the first conductive layer to expose a portion of the dielectric layer; and
    removing the exposed dielectric layer.

3. The method of claim 2 further comprising:
    filling the trench with a second conductive layer; and
    recessing the second conductive layer.

4. The method of claim 1 further comprising:
    forming the first insulating layer along the sidewalls of the trench;
    filling the trench with a photoresist;
    recessing the photoresist to the level to expose a portion of the first insulating layer; and
    removing the exposed first insulating layer.

5. The method of claim 1 further comprising forming the second insulating layer in an atomic layer deposition (ALD) process.

6. The method of claim 1 further comprising forming the oxide in a local oxidation of silicon (LOCOS) process.

7. A method for manufacturing a trench capacitor comprising:
    defining a semiconductor substrate;
    forming a trench with a lower region and an upper region in the semiconductor substrate;
    forming a buried conductive region around the lower region;
    forming a first insulating layer along sidewalls of the trench;
    filling the trench with a photoresist;
    recessing the photoresist to a first level between the lower region and the upper region to expose a portion of the first insulating layer;
    removing the exposed first insulating layer;
    forming a second insulating layer along the sidewalls of the trench at the upper region, the second insulating layer being separated from the first insulating layer by an intermediate region; and
    oxidizing the sidewalls at the intermediate region using the first and second insulating layers as masks.

8. The method of claim 7 further comprising:
    removing the first and second insulating layers;
    forming a dielectric layer along the sidewalls and a bottom surface of the trench;
    filling the trench with a first conductive layer;
    recessing the first conductive layer to a second level between the first level and the upper region to expose a portion of the dielectric layer; and
    removing the exposed dielectric layer.

9. The method of claim 8 further comprising:
    filling the trench with a second conductive layer; and
    recessing the second conductive layer.

10. The method of claim 7 further comprising forming the second insulating layer in an atomic layer deposition (ALD) process.

11. The method of claim 7 further comprising forming the oxide in a local oxidation of silicon (LOCOS) process.

12. A method of manufacturing a trench capacitor comprising:
    defining a semiconductor substrate;
    forming a trench with a lower region and an upper region in the semiconductor substrate, the trench further including sidewalls;
    forming a first conductive region around the lower region;
    forming a collar oxide on and into the sidewalls of the trench at an intermediate region between the lower region and the upper region;
    forming a dielectric layer along the sidewalls up to a level above the collar oxide; and
    forming a second conductive layer up to the level.

13. The method of claim 12 further comprising:
    forming a first insulating layer along the sidewalls of the trench up to a lower level of the intermediate region;
    forming a second insulating layer along the sidewalls of the trench down to an upper level of the intermediate region; and
    oxidizing the sidewalls of the trench at the intermediate region.

14. The method of claim 13 further comprising:
    forming the first insulating layer along the sidewalls of the trench;
    filling the trench with a photoresist;
    recessing the photoresist to the lower level to expose a portion of the first insulating layer; and
    removing the exposed first insulating layer.

15. The method of claim 13 further comprising forming the second insulating layer in an atomic layer deposition (ALD) process.

16. The method of claim 13 further comprising oxidizing the sidewalls of the trench at the intermediate region in a local oxidation of silicon (LOCOS) process using the first and second insulating layers as masks.

17. A trench capacitor comprising:
   a trench formed into a semiconductor substrate including a lower region and an upper region;
   a first conductive region formed around the lower region of the trench;
   a collar oxide formed on and into sidewalls of the trench at an intermediate region between the lower region and the upper region, the collar oxide extending partially beyond the sidewalls of the trench at the upper region;
   a dielectric layer formed along the sidewalls of the trench at least up to a top level of the collar oxide; and
   a second conductive region formed up to the level.

18. The trench capacitor of claim 17 further comprising a third conductive region formed over the second conductive region.

19. The trench capacitor of claim 17, the dielectric layer further including a nitride-oxide structure or an oxide-nitride-oxide structure.

20. The method of claim 17, the dielectric layer being formed along the sidewalls of the trench up to a level above the collar oxide.

* * * * *